(12) United States Patent
Viza et al.

(10) Patent No.: US 6,289,579 B1
(45) Date of Patent: Sep. 18, 2001

(54) COMPONENT ALIGNMENT AND TRANSFER APPARATUS

(75) Inventors: Daniel J. Viza; Charles Di Ruzzio, both of Phoenix; Justin H. Smart, Scottsdale, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/273,640

(22) Filed: Mar. 23, 1999

(51) Int. Cl.$^7$ ............................................ B23P 19/00
(52) U.S. Cl. ............................ 29/740; 29/739; 29/759; 29/760
(58) Field of Search ........................ 29/739, 740, 741, 29/757, 759, 760, 742, 743; 221/227, 231; 198/347.3, 797, 799, 457.07, 458

(56) References Cited

U.S. PATENT DOCUMENTS

| | | | |
|---|---|---|---|
| 3,785,462 | * | 1/1974 | Coad et al. ............................ 187/18 |
| 4,170,192 | * | 10/1979 | Maddock ............................ 118/306 |
| 4,434,912 | * | 3/1984 | Larson ................................ 221/227 |
| 4,764,079 | * | 8/1988 | Linker, Sr. et al. ................. 414/411 |
| 4,868,977 | * | 9/1989 | Maruyama et al. .................... 29/823 |
| 4,874,075 | * | 10/1989 | Linker et al. ........................ 193/39 |
| 5,070,601 | * | 12/1991 | Shitanda et al. ...................... 29/740 |
| 5,342,460 | * | 8/1994 | Hidese .................................. 156/64 |
| 5,613,435 | * | 3/1997 | Kuckhermann et al. ............ 100/196 |

FOREIGN PATENT DOCUMENTS

| | | | | |
|---|---|---|---|---|
| 3-30499 | * | 2/1991 | (JP) ...................................... 29/740 |
| 5-75299 | * | 3/1993 | (JP) ...................................... 29/740 |

* cited by examiner

*Primary Examiner*—Lee Young
*Assistant Examiner*—Minh Trinh
(74) *Attorney, Agent, or Firm*—Douglas D. Fekete

(57) ABSTRACT

A component alignment and transfer apparatus is disclosed which includes an accumulator for accumulating and aligning a plurality of components and a transfer head for transferring the accumulated and aligned components from the accumulator to a collection receptacle. The transfer head includes a scissor mechanism having a plurality of sections, with each section including a pair of scissor arms intersecting at a pivot point and a suction pickup. The plurality of sections are pivotally connected to form an elongated transfer head movable between a first position having a first spacing between suction pickups and a second position having a second spacing between suction pickups. An actuator is connected to move the suction pickups between the first position and the second position.

4 Claims, 4 Drawing Sheets

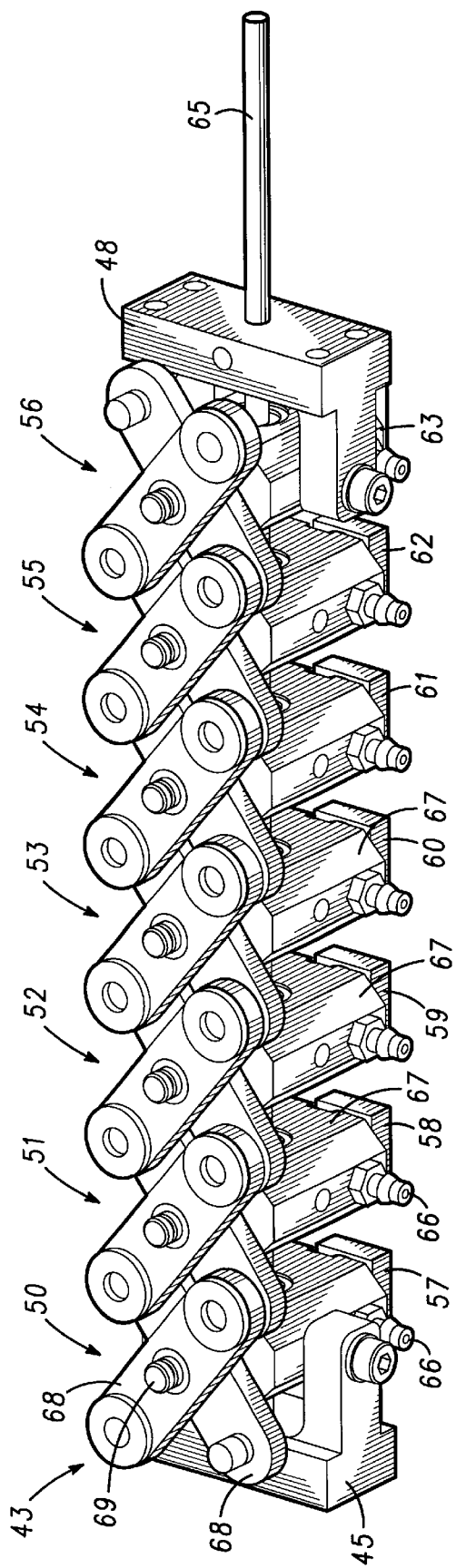
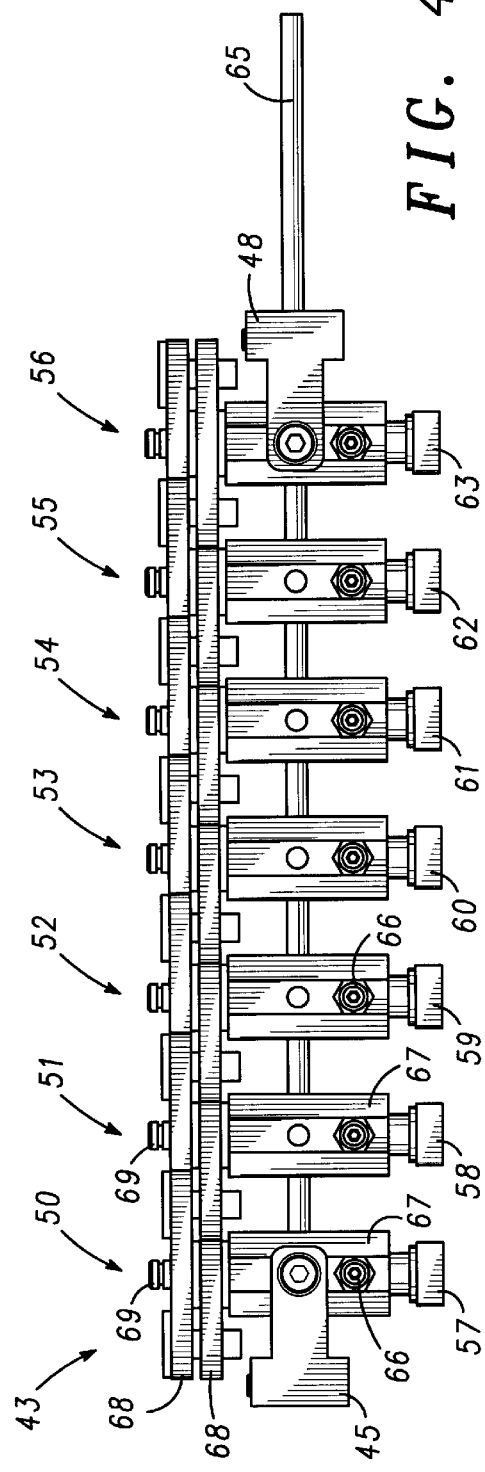
FIG. 3
FIG. 4

COMPONENT ALIGNMENT AND TRANSFER APPARATUS

FIELD OF THE INVENTION

The present invention pertains to apparatus for aligning components and transferring the aligned components to shipping and/or handling containers and more specifically to an improved transfer head for the apparatus.

BACKGROUND OF THE INVENTION

In many industries and especially the electronics industry a plurality of components, such as integrated circuits, are encapsulated simultaneously in a common mold. The individual components must then be separated into singulated packages and properly positioned in shipping and/or handling containers. One problem that arises is damage to the packages during the transfer.

Typical packages that are subjected to this process are a Fine Pitch Ball Grid Array (FBGA) and similar electronic packages. These electronic packages are generally rectangular in cross-section and include rows of solder bumps or spheres on the lower surface, the solder bumps or spheres being electrical contacts for the package as well as a means for mounting the package on a surface, i.e. a printed circuit board or the like. It is important that the solder bumps or spheres not be contacted during the alignment and transfer procedures to prevent inducing damage to the solder bumps or spheres. In the case of the FBGA package, the distance from the solder bump or sphere feature to the edge of the package is very small and may be less than 0.6 mm. Thus, there is substantially no bottom side edge which can be used to support the package during alignment and transfer procedures. Also, in many instances the sides or edges of the package are used for alignment purposes during "pick and place" procedures so that damage to the sides and/or edges of the packages should be avoided during the alignment and transfer procedures.

In addition to the need to prevent damage to the package and any solder bumps or spheres, if present, there is generally a problem with a difference in package pitch between the source of the packages in the separation fixture and the pitch of the packages in the shipping and/or handling containers. In the electronics industry, for example, the shipping and/or handling containers generally include pockets defined in a process tray, the pockets being regularly spaced in both rows and columns to enhance "pick and place" procedures. There may also be a difference in the number of packages in a row or column at the separation fixture and a row or column at the shipping and/or handling containers. This creates a situation where partial rows or columns in either the source or destination must be addressed. Similarly, a large number of different package sizes, ranging from 2.5 mm to 30 mm in the electronics industry, and shapes, ranging from square to rectangular outlines, create a situation that must be considered. Further, the time to accomplish package alignment and transfer must be minimized, generally exceeding a rate of one package per second, while generally maintaining package integrity within a lot and providing proper final orientation.

Accordingly, it would be highly desirable to provide component alignment and transfer apparatus which solves the above problems.

It is a purpose of the present invention to provide new and improved component alignment and transfer apparatus.

It is another purpose of the present invention to provide a new and improved transfer head for component alignment and transfer apparatus.

It is a further purpose of the present invention to provide new and improved component alignment and transfer apparatus in which package spacing is quickly and easily changed from an aligned position to a correct spacing for transfer into shipping and/or handling containers.

SUMMARY OF THE INVENTION

The above problems and others are at least partially solved and the above purposes and others are realized in component alignment and transfer apparatus including an accumulator for accumulating and aligning a plurality of components and a transfer head for transferring the accumulated and aligned components from the accumulator to a collection receptacle. The transfer head has a plurality of suction pickups mounted in a linear spaced apart relation and movable between a first position having a first spacing between suction pickups and a second position having a second spacing between suction pickups and an actuator for moving the plurality of suction pickups between the first position and the second position.

In a specific embodiment the transfer head includes a scissor mechanism having a plurality of sections, each section including a pair of scissor arms intersecting at a pivot point and a suction pickup. The plurality of sections are pivotally connected to form an elongated transfer head movable between a first position having a first spacing between suction pickups and a second position having a second spacing between suction pickups. An actuator moves the suction pickups between the first position and the second position.

BRIEF DESCRIPTION OF THE DRAWINGS

Referring to the drawings:

FIG. 3 is enlarged isometric view of a portion of the transfer head of FIG. 2, in an extended position;

FIG. 4 is a view in side elevation of the portion of the transfer head illustrated in FIG. 2.

DESCRIPTION OF THE PREFERRED EMBODIMENTS

Figure 1:
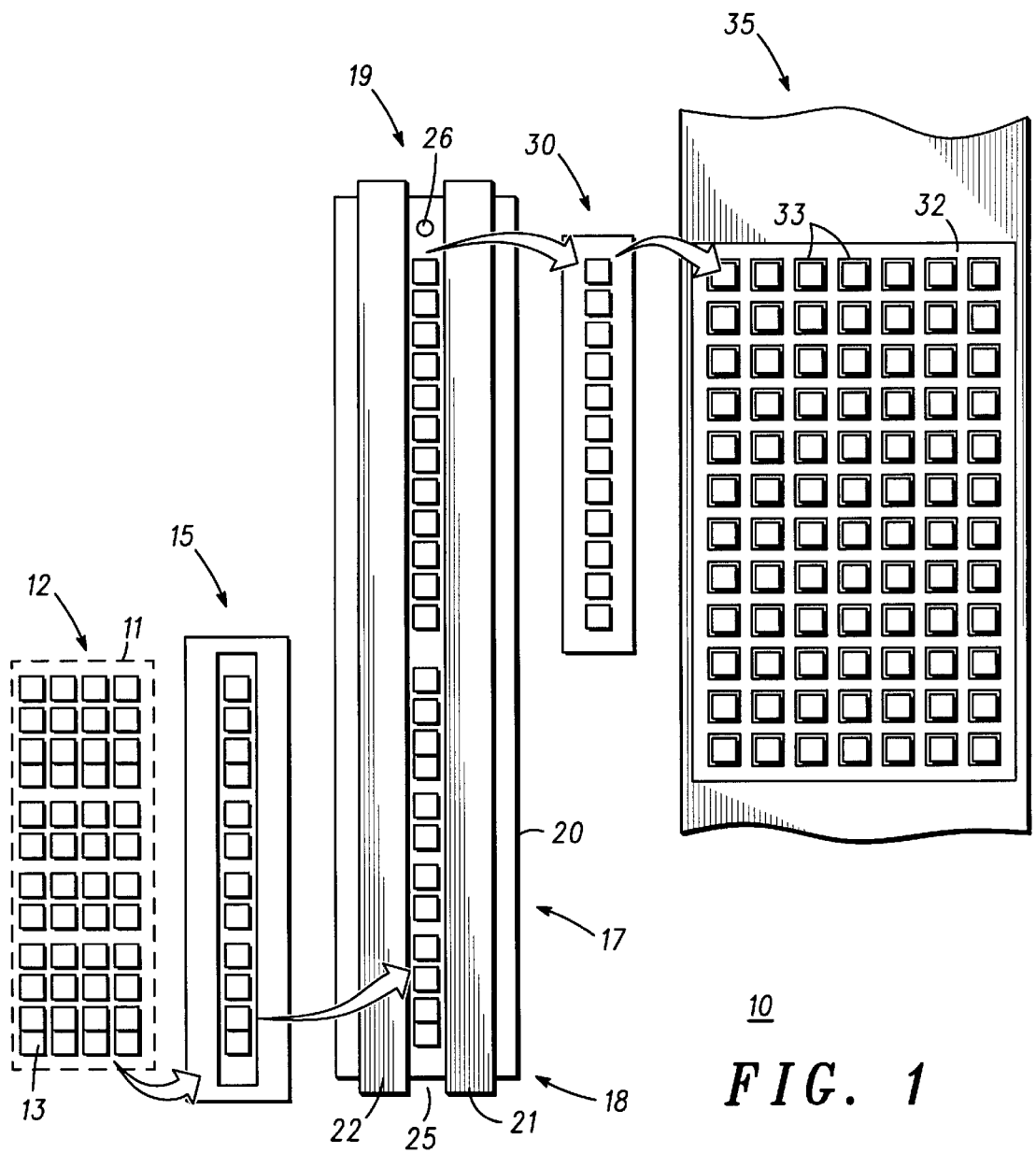
FIG. 1 is a flow diagram illustrating schematically, component alignment and transfer apparatus in accordance with the present invention and the movement of components therethrough.

Turning now to the figures, FIG. 1 is a flow diagram illustrating schematically, component alignment and transfer apparatus 10 in accordance with the present invention and the movement of components therethrough. While a variety of components can be aligned and transferred to shipping and/or handling containers with apparatus 10, in this specific example an array 12 including a plurality of electronic packages or components 13 (e.g. FBGA packages) are illustrated to best show the advantageous capabilities of apparatus 10. Apparatus 10 includes a component stage 11 upon which array 12 of components 13 is positioned. Array 12 includes a plurality of individual packages or components 13 which, in the electronic industry, might include integrated circuits or the like and are encapsulated simultaneously in a common mold. After encapsulation components 13 are separated into singulated packages, for example through the use of a commercial wafer saw or the like. Array 12 is then cleaned, for example by removing debris with a temperature controlled DI water spray and air drying.

After separation and cleaning, array 12 is positioned on stage 11 in rows and columns. A pickup head or end of arm fixture, generally designated 15, picks a complete row of components 13 from array 12 for transferring from stage 11 to an accumulator 17. It will of course be understood that while a complete row is picked in this example, end of arm fixture 15 could be designed to pick columns, etc. Generally, end of arm fixture 15 includes a vacuum manifold and changeable pickup plate which engages a complete row of components 13 as illustrated. The pickup plate includes vacuum orifices of suitable geometry and compliance with components 13 to accomplish the picking. As will be understood, the vacuum orifices may be designed to accommodate multiple product sizes.

Accumulator 17 has a first end 18 and a second end 19 with rows of components 13 being introduced at first end 18 and removed at second end 19, as will be explained in more detail presently. Accumulator 17 includes a base 20 with a pair of elongated parallel rails 21 and 22 mounted on base 20 for relative lateral movement between a loading position and an aligning position. Rails 21 and 22 define a component receiving channel 25 therebetween. A row of components 13 is picked from stage 11 and placed on the centerline of channel 25 with rails 21 and 22 in the loading position, i.e. rails 21 and 22 are positioned laterally apart a distance greater than the lateral dimension of components 13. As one or both of rails 21 and 22 are moved laterally toward each other into the aligning position, the row of components 13 positioned on the centerline in channel 25 is moved so that the edges of individual components 13 move into alignment.

A plurality of apertures are formed adjacent the channel and are connected to a source of gas for urging components 13 from first end 18 to second end 19 with rails 21 and 22 in the aligning position. The aligned row of components 13 travels along channel 25 to second end 19 where it engages a fixed stop 26, which ensures accumulation of components 13 in the row, i.e. each component 13 in the row butts against an adjacent component 13. Once the row of components 13 is accumulated and aligned at second end 19, the gas is turned off and rails 21 and 22 are moved into the loading position. A transfer head 30 transfers the accumulated and aligned components 13 from second end 19 of accumulator 17 to a collection receptacle 32. For maximum efficiency, end of arm fixture 15 will generally be simultaneously placing a new row of components in channel 25 at first end 18. A specific embodiment of transfer head 30 is explained below in conjunction with FIGS. 2 through 5.

In the embodiment illustrated in FIG. 1, collection receptacle 32 is a tray with a plurality of rows of individual component receiving depressions or pockets 33. In some instances, it may be advantageous to include a repositioning plate as an intermediate step between accumulator 17 and collection receptacle 32. The repositioning plate includes pockets with tapered sides to more accurately position each component 13 in the row. In this instance, transfer head 30 moves the row of components from accumulator 17 to the repositioning plate and then picks the row up again and places it in collection receptacle 32. In either instance, collection receptacle 32 is positioned in a tray positioning system 35 in which collection receptacle 32 is accurately clamped in position by some convenient means. Various process strategies may be employed to fill collection receptacle 32 by rows, columns, partial rows or columns, etc.

Figure 2:
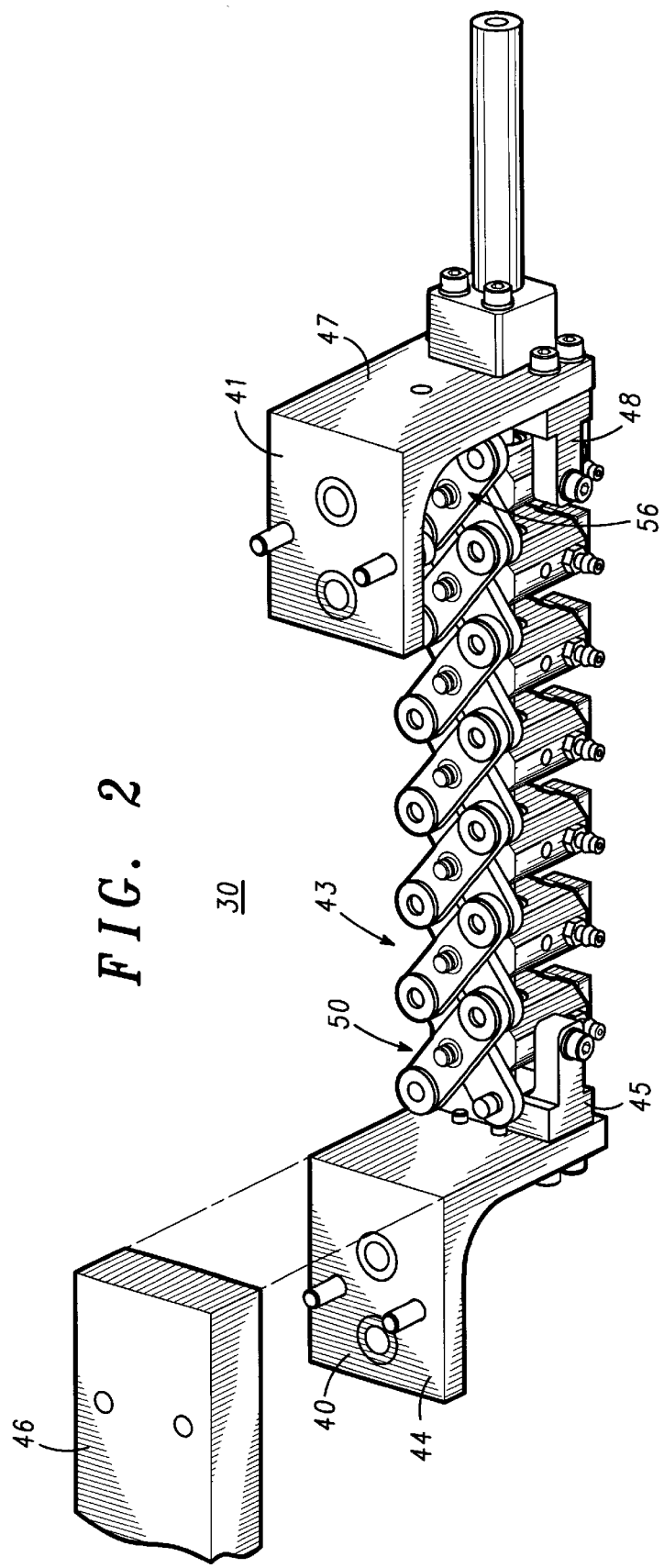
FIG. 2 illustrates a specific embodiment for the transfer head of the component alignment and transfer apparatus illustrated schematically in FIG. 1.

Turning now to FIG. 2, a specific embodiment for transfer head 30 of component alignment and transfer apparatus 10 is illustrated in an isometric view with transfer head 30 in the closed position. A pair of spaced apart mounting members 40 and 41 are affixed to opposite ends of a scissor mechanism 43. Mounting member 40 includes an L-shaped bracket 44 having one leg affixed to the bight of a U-shaped block 45 and the perpendicular other leg fixedly attached to a pick and place type of arm 46 (partially removed for clarity). Mounting member 41 includes an L-shaped bracket 47 having one leg affixed to the bight of a U-shaped block 48 and the perpendicular other leg fixed to arm 46 for longitudinal movements relative to mounting member 40, as will be understood presently. Scissor mechanism 43 is made up of a plurality of sections, in this specific embodiment seven, designated 50 through 56 which are pivotally connected together for longitudinal movement with section 50 being affixed between the arms of U-shaped block 45 and section 56 being affixed between the arms of U-shaped block 48. Scissor mechanism 43 is illustrated in the closed position in FIG. 2. It will be understood by those skilled in the art that scissor mechanism 43 is a preferred embodiment for achieving an easily spaced transfer head to transfer components from accumulator 17 to collection receptacle 32 and that other mechanisms may be devised from this disclosure.

Referring specifically to FIG. 3, an enlarged isometric view of scissor mechanism 43 of transfer head of FIG. 2 is illustrated. In FIG. 3 scissor mechanism 43 is shown in an extended position. Referring additionally to FIG. 4, a view in side elevation of scissor mechanism 43 is illustrated in which suction pickups 57 through 63, one for each section 50 through 56 respectively, can be seen. An actuator, which in this specific embodiment includes a shaft 65 that extends through the center of each section 50 through 56 and is fixedly engaged in an opening in the bight of U-shaped block 45. Shaft 65 is slideably engaged in an opening in each section 50 through 56 and is also slideably engaged through an opening in the bight of U-shaped block 48. Shaft 65 and/or some other mechanism (not shown) can be used as an actuator to move scissor mechanism 43 between the various selected positions, e.g. the closed position and the extended position. Generally, arm 46, carrying and moving transfer head between accumulator 17 and collection receptacle 32 operates the actuator so as to move scissor mechanism 43 into the pickup position at accumulator 17 and into the extended position at collection receptacle 32.

In operation, scissor mechanism 43 is moved into a pickup position in which suction pickups 57 through 63 are positioned to engage packages 13 in accumulator 17 when they are in the aligned and accumulated (abutting) position at second end 19. The pickup position will generally be the closed position illustrated in FIG. 2 but it will be understood that virtually any position corresponding with the spacing of packages 13 can be achieved. A suction or low pressure is applied to suction pickups 57 through 63 by way of an inlet fitting 66 coupled to an inlet of a manifold 67, which forms a body for each section 50 through 56. Each section further includes a pair of a pair of scissor arms 68 intersecting at a pivot point 69 affixed to the associated manifold 67. In this embodiment, suction pickups 57 through 63 are positioned on the axis of pivot point 69 of each section 50 through 56 for additional positioning accuracy. By constructing each section 50 through 56 the same, extending and contracting movements of scissor mechanism 43 results in positioning the plurality of suction pickups 50 through 56 in a linear spaced apart relation, with the amount of spacing being a factor of the amount of extension of scissor mechanism 43.

Figure 5:
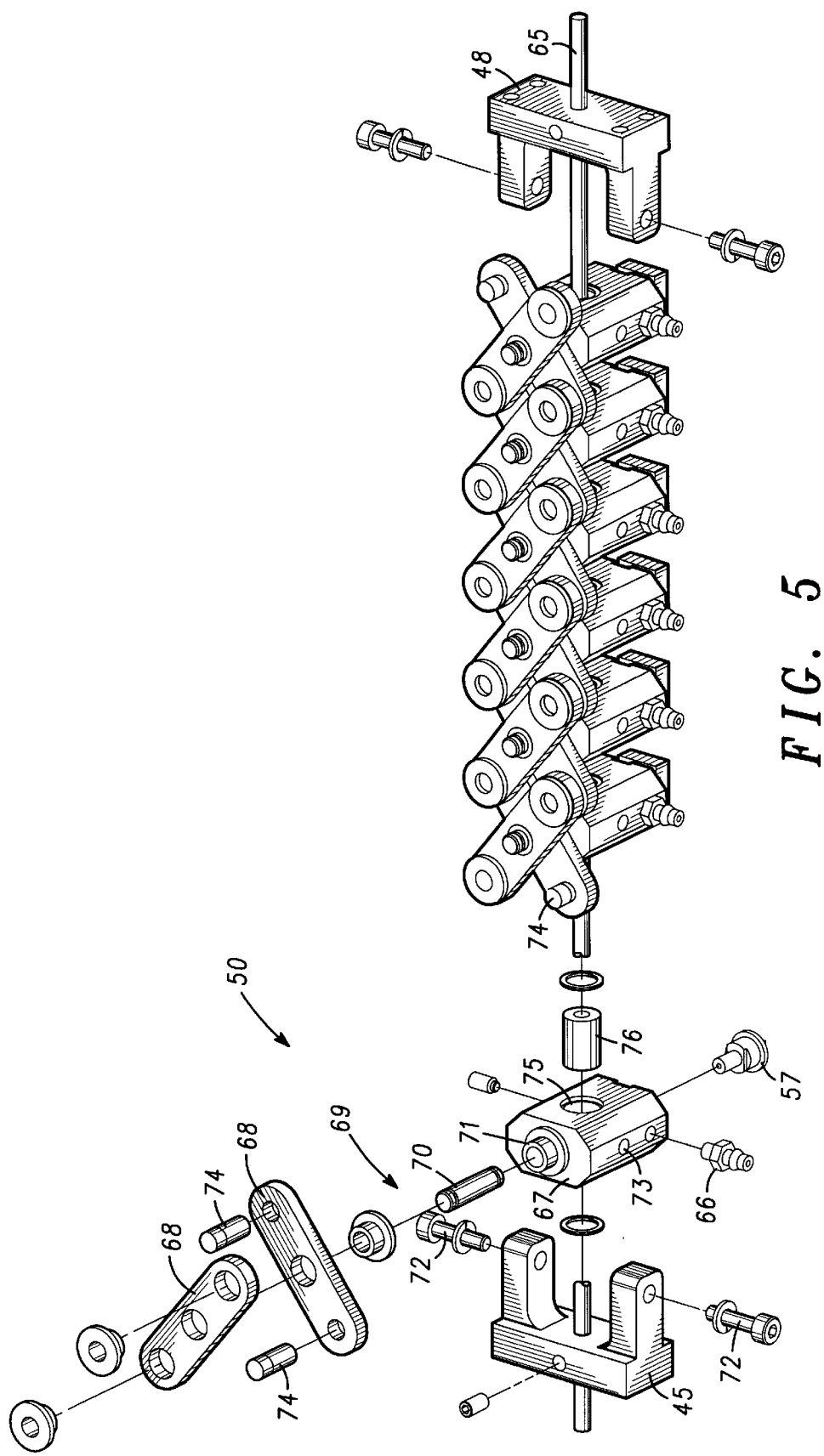
FIG. 5 is an isometric view of the portion of the transfer head illustrated in FIG. 2, with portions thereof exploded to illustrate individual components.

Turning now to FIG. 5, an isometric view of scissor mechanism 43 is illustrated with portions thereof exploded to illustrate individual components. Since sections 50 through 56 are all similar, only section 50 is illustrated in the exploded view. Manifold 67 serves as the body for section 50 with scissor arms 68 pivotally mounted to an upper surface by means of a pivot pin 70 which extends through scissor arms 68 and into a bearing sleeve 71 in opening in manifold 67. Manifold 67 is attached to U-shaped block 45 by means of two screws 72 that extend through openings in the ends of the arms of U-shaped block 45 and are threadedly engaged in openings 73 in the sides of manifold 67. The ends of scissor arms 68 adjacent to section 51 are pivotally attached to the ends of the scissor arms of section 51 by means of pivot pins 74. An opening 75 through manifold 67 has a bearing sleeve 76 engaged therein for allowing the free movement of shaft 65 therethrough. Each manifold 67 (mounting body) is identical so that more or less sections can be quickly and easily included in scissor mechanism 43. It will of course be understood that none of the openings 73 and 75 or the bearing sleeves 71 and 76 are actually in communication with the suction or low pressure applied at inlet fitting 66 and present at suction pickup 57.

Thus, new and improved component alignment and transfer apparatus is disclosed with a new and improved transfer head. The new and improved component alignment and transfer apparatus is constructed so that package spacing is quickly and easily changed from an aligned position to a correct spacing for transfer into shipping and/or handling containers. In the specific embodiment disclosed the transfer head engages a complete row of components 13 as illustrated but columns, partial rows or columns, etc. can be engaged if desired. As an example, two or more suction pickups can be engaged with a single very large package. The transfer head includes suction pickups of suitable geometry and compliance with components 13 to accomplish the picking. As will be understood, the suction pickups and the spacing between the suction pickups may be quickly and easily modified to accommodate multiple product sizes and the number of sections in the scissor mechanism can be easily and quickly changed to accommodate more or less packages in a row, column, etc. Further, the component or package alignment and transfer apparatus is constructed so that contact with sensitive or critical portions of the package is minimized. Further, the new package alignment and transfer apparatus is constructed so that alignment and transfer of the packages easily exceeds a rate of one package per second, while generally maintaining package integrity within a lot and providing proper final orientation. The sequential alignment and transfer of entire rows or columns of a specific lot ensures the maintenance of package integrity within a lot.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A component alignment and transfer apparatus for transferring a plurality of components aligned in an accumulator, said component alignment and transfer apparatus comprising;

a transfer mechanism for transferring components from the accumulator, said transfer mechanism comprising;

a transfer head including a scissor mechanism having a plurality of sections, each section including a pair of scissors arms intersecting at a pivot point and a suction pickup disposed at the pivot point, the plurality of sections being pivotally connected and movable between a first position wherein the suction pickups exhibit a first spacing therebetween adapted for engaging components at said accumulator and a second position wherein the suction pickups exhibit a second spacing, said transfer head further comprising an actuator for moving the suction pickups between the first position and the second position; and an arm for moving the transfer head to convey components from the accumulator.

2. The component alignment and transfer apparatus as claimed in claim 1 wherein the scissor mechanism includes end sections and further wherein the transfer head includes first and second mounting members attached to the end sections.

3. The component alignment and transfer apparatus as claimed in claim 2 wherein the actuator includes a rod fixed to the first mounting member and slidably received by the second mounting member whereby the first mounting member is movable relative to the second mounting member thereby moving the plurality of suction pickups between the first position and the second position.

4. The component alignment and transfer apparatus as claimed in claim 3 wherein the plurality of suction pickups each includes a body coupled to the pivot point and carrying a manifold, a pickup head coupled to the manifold and engagable with a component of the plurality of components and a suction connector for coupling the manifold to a suction source, the body being stabilized by the rod of the actuator extending therethrough.

\* \* \* \* \*